(12) United States Patent
Chi et al.

(10) Patent No.: US 8,264,863 B2
(45) Date of Patent: Sep. 11, 2012

(54) GREEN TRANSISTOR FOR NANO-SI FERRO-ELECTRIC RAM AND METHOD OF OPERATING THE SAME

(75) Inventors: Min-hwa Chi, Shanghai (CN); Deyuan Xiao, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 141 days.

(21) Appl. No.: 12/869,941

(22) Filed: Aug. 27, 2010

(65) Prior Publication Data

US 2011/0090731 A1 Apr. 21, 2011

(30) Foreign Application Priority Data

Oct. 20, 2009 (CN) .......................... 2009 1 0197451

(51) Int. Cl.
*G11C 11/22* (2006.01)
(52) U.S. Cl. ........................................ 365/145; 365/148
(58) Field of Classification Search ............... 365/49.13, 365/65, 109, 117, 145, 203, 205, 207; 327/50–57; 257/295, E21.208, E21.663, E21.664, E27.104, 257/E29.164; 438/3
See application file for complete search history.

(56) References Cited

U.S. PATENT DOCUMENTS

| | | | |
|---|---|---|---|
| 6,163,482 A | | 12/2000 | Chi |
| 6,370,056 B1 * | | 4/2002 | Chen et al. ................. 365/145 |
| 6,656,748 B2 * | | 12/2003 | Hall et al. ........................ 438/3 |
| 7,583,534 B2 * | | 9/2009 | Forbes et al. ............ 365/185.18 |
| 7,839,710 B2 * | | 11/2010 | Kam et al. ..................... 365/215 |
| 2003/0143800 A1 * | | 7/2003 | Hall et al. ...................... 438/240 |
| 2008/0239930 A1 * | | 10/2008 | Saito et al. .................... 369/126 |
| 2009/0129139 A1 * | | 5/2009 | Kam et al. ..................... 365/129 |

OTHER PUBLICATIONS

Chenming Hu, et al., "Green Transistor—A $V_{DD}$ Scaling Path for Future Low Power ICs", 2 pages, 2008 IEEE.

* cited by examiner

*Primary Examiner* — Richard Elms
*Assistant Examiner* — Harry W Byrne
(74) *Attorney, Agent, or Firm* — Squire Sanders (US) LLP

(57) ABSTRACT

The present disclosure provides a green transistor for nano-Si Ferro-electric random access memory (FeRAM) and method of operating the same. The nano-Si FeRAM includes a plurality of memory cells arranged in an array with bit-lines and word-lines, and each memory cell includes a MOSFET including a gate, a source, a drain, a substrate, and a data storage element formed on the drain spacer of the gate and made of nano-Si in porous $SiO_2$; a word-line connected to the gate; a first bit-line connected to the drain; a second bit-line connected to the source; and an substrate bias supply connected to the substrate, and the gate induced drain leakage current of the MOSFET serves as the read current of the memory cell.

8 Claims, 15 Drawing Sheets

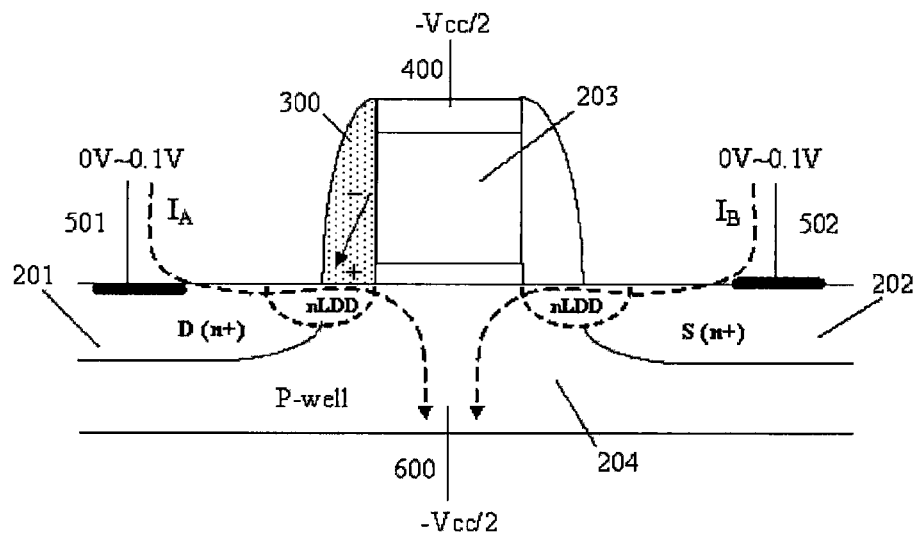

Fig. 3a

| Applying voltages at the first bit-line, at the second bit-line and at the substrate bias supply, and make sure the voltage across the drain and the substrate is the same as the voltage across the source and the substrate. | — S100 |

| Applying a negative voltage (-Vcc/2) at the gate through the word-line to induce GIDL current at the drain and the GIDL at source (as reference current) of the MOSFET. By comparing the magnitude of the GIDL currents, the data in the memory cell can be determined. | — S101 |

Fig. 3b

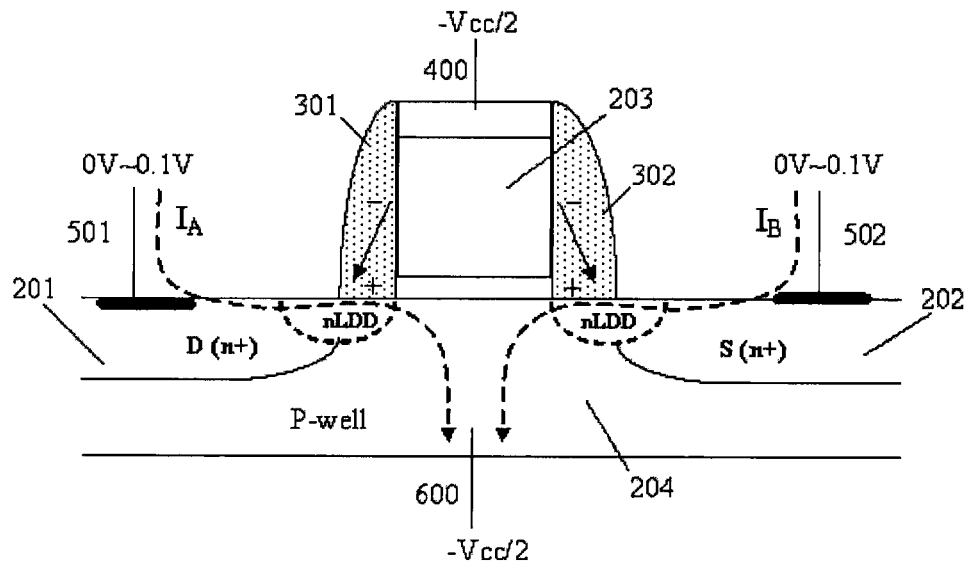

Fig. 6a

| Applying voltages at the first bit-line, at the second bit-line and at the substrate bias supply, and the voltage across the drain and the substrate is the same as the voltage across the source and the substrate. | — S200 |

| Applying a voltage at the gate through the word-line to induce GIDL currents at the drain and the source of the MOSFET. By measuring the magnitude of the two GIDL currents separately with respect to a reference current, the 2 bits of data in the memory cell can be determined. | — S201 |

Fig. 6b

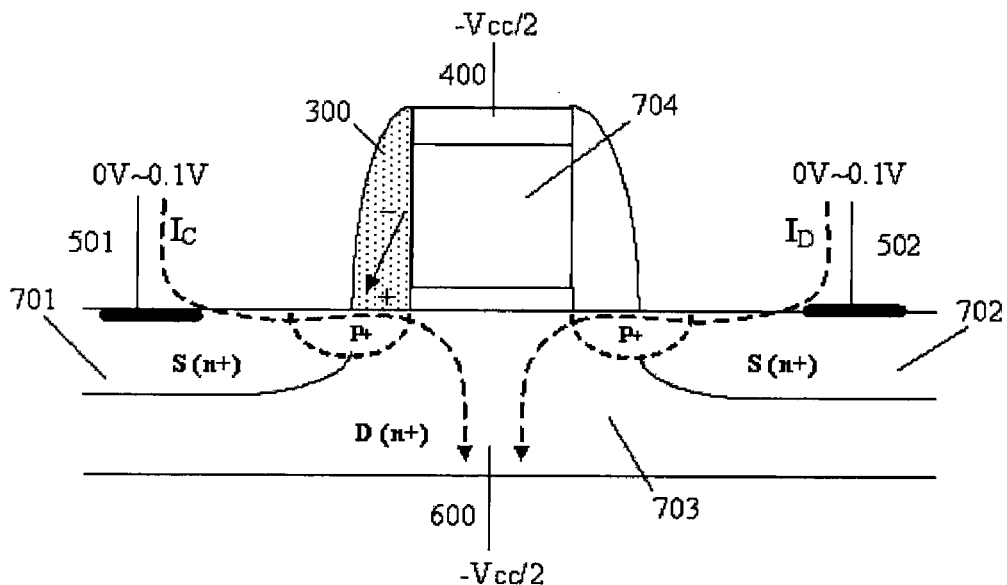

Fig. 10a

```
┌─────────────────────────────┐
│ Applying voltages at the first bit-line, │
│ at the second bit-line and at the │
│ substrate bias supply, and ensuring │
│ the same bias at the first source and │
│ the second source. │         ─── S300
└─────────────────────────────┘
              │
┌─────────────────────────────┐
│ Applying a voltage at the gate through │
│ the word-line to induce turn-on current │
│ at the first source and the second │
│ source of the gFET. The bias at the gate │ ─── S301
│ is large enough to trigger large enough │
│ turn-on current at the first source and │
│ the second source for comparing their │
│ magnitude of the two turn-on currents so │
│ that the data in the memory cell can be │
│ determined. │
└─────────────────────────────┘
```

Fig. 10b

GREEN TRANSISTOR FOR NANO-SI FERRO-ELECTRIC RAM AND METHOD OF OPERATING THE SAME

CROSS REFERENCE TO RELATED APPLICATIONS

The present application claims the priority of Chinese Patent Application No. 200910197451.8, entitled "Green transistor for nano-Si ferro-electric RAM and method of operating the same", and filed on Oct. 20, 2009, the entire disclosure of which is incorporated herein by reference.

BACKGROUND OF THE INVENTION

1. Field of the Invention

The present invention relates to integrated circuit memory, and particularly it relates to green transistor serving as select transistor for nano-Si ferro-electric RAM and method of operating the same.

2. Description of Prior Art

FeRAM (Ferro-electric RAM) is a nonvolatile memory which utilizes the ferro-electric effect of ferro-electric material to realize data storage. The ferro-electric effect occurs when a strong external electric field is applied to a ferro-electric material, the ions in the ferro-electric crystal may be displaced from its position so that the positive and negative charge centers do not coincide with each other, i.e. a polarization is formed in the material. Furthermore, when the external electric field is removed, the polarization still remains. Therefore, the ferro-electric effect has been proposed to be used as non-volatile memory (referred to as ferro-electric memory or FeRAM) with attractive features of small cell size, low-voltage operation, and fast program/erase. However, the manufacturing process for FeRAM is not compatible with CMOS process, e.g. the conventional ferro-electric materials (e.g. PZT, BST) are easily degraded by hydrogen annealing in CMOS flow and leads to poor memory retention. Therefore, there is a need for new ferro-electric material which is compatible with the CMOS process for the development of FeRAM.

Recently, the "nano-Si in porous $SiO_2$" demonstrates its ferro-electric effect and fabrication method highly compatible with CMOS process. FIG. 14 illustrates the structure of nano-Si in porous $SiO_2$, which includes nano-Si particles 2 within those nano-size pores or cavities of the porous $SiO_2$ 1. Normally, the nano-Si particles 2 within nano-size pores are randomly embedded in the porous $SiO_2$ 1. When an external electric field is applied to the material of "nano-Si in porous $SiO_2$", the chemical bonds between Si atoms of the nano-Si particles 2 and the oxygen atoms on the inner surface of pores may be distorted toward the direction of the electric field. As a result, these distorted bonds collectively result in average charge separation in the material and therefore polarization is formed and remains there even after the electric field is removed. Therefore, the "nano-Si in porous $SiO_2$" can serve as the ferro-electric material for FeRAM applications. Furthermore, the material and fabrication of nano-Si in porous $SiO_2$ is highly compatible with CMOS process, which can easily replace the PZT based ferro-electric material in FeRAM.

Similar to other nonvolatile memories, a FeRAM contains a plurality of memory cells which forms a memory array. U.S. Pat. No. 6,163,482 proposed a new FeRAM cell using a MOSFET transistor with spacer of ferro-electric material (e.g. PZT or BST) as data storage element. FIG. 15 is a schematic view of such a memory cell with n-channel MOSFET, including a substrate 100, a gate 101 on the substrate 100, a source 102 and a drain 103 inside the substrate 100 and on both sides of the gate 101, a second implant region 104 inside the drain 103 and near the gate 101, the second implant region 104 has the opposite doping type than the source 102 and the drain 103, and a spacer 105 of ferro-electric material is on the gate 101 and near the drain 103.

In the above FeRAM, the MOSFET serves as a select transistor of the memory cell, and the spacer 105 as the data storage element of the memory cell. FIG. 16 illustrates the equivalent circuit of the above FeRAM cell including the MOSFET and the diode inside the drain. An n-type MOSFET in the FeRAM cell is assumed to illustrate the read and write operations in the following text.

During a write operation, the source 102 and drain 103 is left floating, an external electric field across the spacer 105 is established by applying a voltage at the gate 101 and another voltage at the second implant region 104. Under this external electric field with large enough field intensity, the spacer 105 of ferro-electric material can be polarized with the polarization direction (defined as that pointing from the induced negative charge to the induced positive charge inside the spacer 105) the same as the external electric field. Therefore, the polarization in the spacer 105 can be altered with either direction simply by applying a large enough voltage bias with proper polarity across the gate 101 and the second implant region 104. The digital data "1" or "0" can be represented arbitrarily by the direction of the polarization in the spacer 105 corresponding to the bias polarity from the second implant region 104 to the gate 101 or in reverse manner during write operation respectively.

During a read operation, the second implant region 104 is left floating; the gate voltage is higher than the threshold voltage (Vt) of the MOSFET to turn on the MOSFET. Since a polarization in the spacer 105 will induce charge near the channel and affects the magnitude of the turn-on current depending on the direction of polarization. For example, when the polarization in the spacer 105 is from the second implant region 104 to the gate 101, the induced negative charge in the spacer 105 near the drain 103 repels electrons in the channel and lead to low channel current in the NMOS. If the direction of polarization is reversed, the induced positive charge in the spacer 105 near the drain 103 will result in larger channel current. Therefore, the direction of polarization in the spacer 105 (representing the data "1" or "0") can be determined by the magnitude of the channel current. In the above FeRAM, the digital data "1" or "0" is arbitrarily defined corresponding to the low and high channel current respectively.

The future low-power trend needs a device technology that can be operated at low Vdd.

The concept of green MOSFET (referred to as green transistor or gFET) offers one solution for low Vdd operation of transistors, which has been reported by C. Hu et al. in the paper titled 'Green Transistor—A VDD Scaling Path for Future Low Power ICs on 2008, International Symposium on VLSI Technology, Systems and Applications (VLSI-TSA)'. The gFET enhances the band-to-band tunneling (BTBT) and results in large gate-induced-drain-leakage (GIDL) current by implanting the opposite type of dopant into the source or drain. The band-to-band tunneling is a mechanism that electrons move between the valence band and conduction band by tunneling without getting over the energy barrier, thus the gFET can achieve sharper I-V curves between the on and off states better than the well-known limit of 60 mv/decade of the conventional MOSFET.

FIG. 17a illustrates a conventional gFET, including a silicon-on-insulator (SOI) 10, which includes a substrate 11, a buried oxide 12 and a top silicon 13; a gate oxide 16 on the top silicon 13; a gate 17 on the gate oxide; and a source 14 and a drain 15 with different conductivities are formed separately on two sides of the gate oxide 16 and in the top silicon 13. The gFET also includes a neighboring lightly-doped region 19 and a pocket implant region 18 in the top silicon 13, which are separately aligned to each side of the gate oxide 16. Both of the pocket implant region 18 and the lightly-doped region 19 have the same conductivity with the drain 15. And the source 14, the drain 15 and the lightly-doped region 19 all contact with the buried oxide 12, the pocket implant region 18 of less depth does not contact with the buried oxide 12.

For convenience, the type of gFET is defined as the type of the pocket implant region 18, for example, a p-type gFET includes a p-type pocket implant region 18, an n-type source 14, and a p-type drain 15 correspondently. It should be noted that the carriers for conduction in gFET include both electrons and holes. Therefore, among the two terminals of the gFET, the implant region near the pocket implant region 18 is defined as the source 14, and the other implant region is defined as the drain 15. The material of the gate 17 is compatible with the CMOS process, which is metal or doped poly-silicon. A further description of the p-type gFET is in the following.

Referring to FIG. 17b, the band diagram of band-bending near the pocket implant region 18 of the p-type gFET is illustrated with gFET on (solid curves) and off (dotted curves). When the gFET is off (with the gate 17 biased at 0 v or more positive than the source 14), the lower edge of the conduction band (Ec) of the implant region 18 is higher than the upper edge of the valence band (Ev), which leads to a large barrier and no electrons transferring between the conduction band and the valence band. However, when the gFET is on (with the gate 17 biased to negative enough than the source 14), the voltage of the implant region 18 is lowered (or higher potential energy as the solid and diagram curves). Therefore, the upper edge of valence band of the implant region 18 is higher than the lower edge of the conduction band. Under this condition, electrons in the valence band can tunnel into the conduction band, with holes generated in the valence band correspondently.

FIG. 17c illustrates the currents when the p-type gFET is on. Referring to FIG. 17b and FIG. 17c, when the source 14 is biased to a voltage higher than the drain 15 (Vsd>0), and the gate 17 is biased negatively enough than the source 14, the valence band electrons in p-type pocket implant region 18 can tunnel into the conduction band of the n-type source 14. The holes in p-type pocket implant region 18 move toward p-type drain 15 through the lightly-doped region 19 simultaneously. As a result, a current is produced from the source 314 to the drain 315, which shows the gFET is on.

The conduction carriers are both electrons and holes in the gFET after turn-on; this is obviously different from the conduction in conventional MOSFET by majority carriers. The gFET has many advantages than the conventional MOSFET, including smaller sub-threshold swing (smaller than the 60 mV/decade limit in conventional MOSFET), lower turn-on voltage (lower than ~0.2V) of gFET, less power consumption and high driving current. We intend to use the gFET with ferro-electric spacer as the FeRAM cell in this invention.

SUMMARY OF THE INVENTION

It is an object of this invention to provide a nano-silicon ferro-electric random access memory (referred to as nano-Si FeRAM) with MOSFET as select transistors, the nano-Si in porous $SiO_2$ as the spacer material at drain side, and the gate induced drain leakage (GIDL) current as the read current.

It is another object of this invention to provide a method of operating the nano-Si FeRAM.

It is still an object of this invention to provide a nano-Si FeRAM with MOSFET as select transistors, the nano-Si in porous $SiO_2$ as the spacer material at both the drain and source sides, and the GIDL current as the read current.

It is still another object of this invention to provide a method of operating the nano-Si FeRAM above.

It is still another object of this invention to provide a gFET which has two sources with a symmetrical structure.

It is still another object of this invention to provide a nano-Si FeRAM, with gFET as select transistors, the nano-Si in porous $SiO_2$ as the material of storage element in the first-source-spacer of the gFET, and the band-to-band tunneling current of the gFET as read current.

It is still another object of this invention to provide a method of operating the nano-Si FeRAM above.

It is still another object of this invention to provide a nano-Si FeRAM, with gFET as select transistor, the nano-Si in porous $SiO_2$ as the material of storage element in both the first-source and the second-source spacers of the gFET, and the band-to-band tunneling current of the gFET as read current.

It is still another object of this invention to provide a method of operating the nano-Si FeRAM above.

From the first aspect of the present invention, a nano-Si FeRAM is provided, including a plurality of memory cells arranged into an array with bit-lines and word-lines, the bit-lines including first bit-lines and second bit-lines, each memory cell comprising: a MOSFET including a gate, a source, a drain, a substrate, and a data storage element (or the spacer at drain side) made of nano-Si in porous $SiO_2$; a word-line connected to the gate; a first bit-line connected to the drain; a second bit-line connected to the source; and a substrate bias supply connected to the substrate. The GIDL current of the MOSFET serves as the read current of the nano-Si FeRAM cell.

In the nano-Si FeRAM, the MOSFET is assumed n-type. When a memory cell is selected for read or write operations, the voltage applied on the gate through the word-line is smaller in magnitude than the Vt of the MOSFET, so that the channel of the MOSFET in array is never inverted during all operations.

From the second aspect of the present invention, it is provided a method of operating the above nano-Si FeRAM, comprising: a write operation comprising: providing a first voltage at the first bit-line; and providing a second voltage at the word-line to establish a voltage difference (or electric field) between the gate and the drain so that the polarization can be generated in the spacer (i.e. data storage element) of nano-Si in porous SiO2; and a read operation comprising: providing a first voltage at the first bit-line; providing a second voltage same as the first voltage at the second bit-line; providing a third voltage at the substrate to establish voltage difference between the source and the substrate and between the drain and the substrate; providing a fourth voltage at the word-line to trigger GIDL currents at the source and the drain junctions to the substrate; and comparing the two GIDL currents to determine the data.

Throughout the text, data "1" is arbitrarily represented by the polarization from the drain to the gate in the storage element, and "0" is represented by the polarization from the gate to the drain in the storage element. In the read operation, with consistent definition, data "1" is determined when the GIDL at the drain is larger than that at the source; inversely, data "0" is determined when the GIDL at the drain is smaller than that at the source.

From the third aspect of the present invention, it is provided a nano-Si FeRAM, including a plurality of memory cells arranged in an array with bit-lines and word-lines, the bit-lines including first bit-lines and second bit-lines, each memory cell comprising: a MOSFET including a gate, a source, a drain, a substrate, and two data storage elements (i.e. the two spacers of the gate) made of nano-Si in porous $SiO_2$; a word-line connected to the gate; a first bit-line connected to the drain; a second bit-line connected to the source; and an substrate bias supply connected to the substrate, and the GIDL of the MOSFET serves as the read current.

In the nano-Si FeRAM, the MOSFET is assumed an n-type MOSFET. When a memory cell is selected for read or write operations, the voltage applied on the gate through the word-line is smaller in magnitude than the Vt of the MOSFET, so that the channel of the MOSFET in array is never inverted during all operations.

From the fourth aspect of the present invention, it is provided a method of operating the above nano-Si FeRAM, comprising: a write operation comprising: providing a first voltage the first bit-line; providing a second voltage at the second bit-line; and providing a third voltage at the word-line to establish voltage differences between the gate and the drain and between the gate and the source which results in polarization in the two data storage elements; and a read operation comprising: providing a first voltage at the first bit-line; providing a second voltage same as the first voltage at the second bit-line; providing a third voltage at the substrate bias supply to establish voltage difference between the source and the substrate and between the drain and the substrate; providing a fourth voltage at the word-line to trigger the GIDL currents at the source and the drain; and measuring the two gate induced drain leakage currents to read data.

According to one embodiment, for both data storage elements, data "1" is represented by the polarization from the drain toward the gate, and "0" with the polarization from the gate to the drain. The write operation at the drain and source shall be performed in sequential manner if the opposite data (or opposite direction of polarization) is to be stored. In the read operation, data "1" is determined when the GIDL at either the drain or source is larger than a reference current; similarly, data "0" is determined when the GIDL at the drain or source is smaller than a reference current. The read operation can be performed at the drain or source in sequential manner or simultaneously.

According to another embodiment, if the polarizations of the two data storage elements are always written in opposite directions as a pair, e.g. "10" is written into the first and second data storage element respectively or "01" in reverse manner. In the read operation, the GIDL at the drain and source are compared in relative manner, e.g. if GIDL at drain side is larger than at source side, then "10" is stored; if the GIDL at drain side and source side is in reversed magnitude, then "01" is stored. Thus, there is no need of a reference current for determining the polarization separately and the 2 cases of pairs "10" or "01" can be determined rapidly and represent 1 bit of storage (as one embodiment in the $4^{th}$ aspect of this invention).

From the fifth aspect of the present invention, it is provided a gFET comprising: a substrate made of SOI or bulk substrate; a gate formed on the substrate; a drain formed under the gate and in the substrate; a first source formed near one side of the gate and in the drain; a second source formed symmetrically to the first source and in the drain; a first pocket implant region formed in the first source; and a second pocket implant region formed in the second source, and both of the first and the second pocket implant regions have the same conductivity as the drain, and the opposite conductivity to the first and the second source. Compare with conventional gFET, the new gFET is simply a "merged gFET" by two conventional gFETs with shared gate and shared substrate (as the drain).

A lightly-doped region connects the first pocket implant region or the second pocket implant region to the drain, and the lightly-doped region has lower doping concentration than the drain and the same conductivity as the drain.

The first and the second pocket implant region are connected to the drain through the same lightly-doped region, and the lightly-doped region is located between the first and the second pocket implant region in the drain.

From the sixth aspect of the present invention, it is provided a nano-Si FeRAM including a plurality of memory cells arranged in an array with bit-lines and word-lines, the bit-lines including first bit-lines and second bit-lines, each memory cell comprising: a gFET including a data storage element (spacer) formed above the first-source and made of nano-Si in porous $SiO_2$; the spacer above the second source is made of $SiO_2$ (non-ferroelectric material); a word-line connected to the gate of the gFET; a first bit-line connected to the first source of the gFET; a second bit-line connected to the second source of the gFET; and an substrate bias supply connected to the drain of the gFET, and the band-to-band tunneling current of the gFET is the read current of the memory cell.

The gFET is assumed an n-type. During a write operation of a selected memory cell, there is no turn-on current at the gFET.

From the seventh aspect of the present invention, it is provided a method of operating the above nano-Si FeRAM comprising: a write operation comprising: providing a first voltage at the first bit-line; and providing a second voltage at the word-line to establish voltage differences between the gate and the first source which results in polarization in the data storage elements; and a read operation comprising: providing a first voltage at the first bit-line; providing a second voltage same as the first voltage at the second bit-line; providing a third voltage at the substrate bias supply to establish voltage difference between the first source and the drain and between the second source and the drain; providing a fourth voltage at the word-line to trigger the turn-on (GIDL) currents at the first source and the second source; and comparing the two turn-on currents to read data.

In the write operation, data "1" is defined if the polarization in the data storage element is from the first source to the gate; and data "0" is defined if the polarization in the data storage element is from the gate to the first source.

In the read operation, data "1" is determined when the turn-on current at the first source is larger than a reference current at the second source; and data "0" is determined if the turn on current at the first source is smaller than the reference current.

From the eighth aspect of the present invention, it is provided a nano-silicon FeRAM including a plurality of memory cells arranged in array with bit-lines and word-lines, the bit-lines including the first bit-lines and the second bit-lines, each memory cell comprising: a gFET including two data storage elements (i.e. spacers) formed of the gate and made of nano-Si in porous $SiO_2$; a word-line connected to the gate of the gFET; a first bit-line connected to the first source of the gFET; a second bit-line connected to the second source of the gFET; and an substrate bias supply connected to the drain of the gFET, and the band-to-band tunneling current of the gFET is the read current of the memory cell.

The gFET is assumed an n-type. During a write operation of a selected memory cell, there is no turn-on current at the gFET.

From the ninth aspect of the present invention, it is provided a method of operating the above nano-silicon FeRAM comprising: a write operation comprising: providing a first voltage at the first bit-line; providing a second voltage at the second bit-line; and providing a third voltage at the word-line to establish voltage differences between the gate and the first source and between the gate and the second source which generates polarization in the two data storage elements for writing data; if the data in the two data storage elements are different, then the write operation shall be performed in sequential manner; and a read operation comprising: providing a first voltage at the first bit-line; providing a second voltage same with the first voltage at the second bit-line; providing a third voltage at the substrate bias supply to establish voltage difference between the first source and the drain and between the second source and the drain; providing a fourth voltage at the word-line to trigger the turn-on current at the first source and the second source; and measuring the two turn-on currents with respect to the reference current respectively in order to read data.

According to one embodiment, for both data storage elements, each data storage element stores 1 bit of data depending on the direction of polarization as resulted from the write operation. In the read operation at the first source and the second source, a larger turn-on current (than the reference current) represents data "1" and a smaller turn-on current represents data "0".

According to another embodiment, if the polarizations in the two data storage elements are stored in opposite as pairs, e.g. "10" is written into the first and second data storage elements respectively or "01" in reverse manner. In the read operation, data "10" is determined if the turn-on current at the first source is larger than that at the second source; and data "01" if in reverse manner. Thus, there is no need of a reference current in sense amplifier for determining the polarization separately and the 2 cases of pairs "10" or "01" can be determined rapidly to represent 1 bit of data.

Many benefits are achieved by the present invention over conventional techniques. Firstly, the "nano-Si in porous $SiO_2$" is used as the ferro-electric material of the storage element in FeRAM with its fabrication compatible with the standard CMOS process; thus better retention can be achieved than conventional FeRAM; Secondly, the use of GIDL current of the MOSFET as read current result in lower power and lower voltage for read and write operations; and Thirdly, the use of gFET as select transistors results in superior scalability for higher density, and the power consumption of select transistors is also greatly reduced.

BRIEF DESCRIPTION OF THE DRAWINGS

The object and other advantages of this invention are best described in the preferred embodiments with reference to the attached drawings that include:

FIG. 3a illustrates the read operation of the first nano-Si FeRAM;

FIG. 3b is a flow chart of the read operation of the first operating method;

FIG. 6a illustrates the read operation of the second nano-Si FeRAM;

FIG. 6b is a flow chart of the read operation of the second operating method;

FIG. 10a illustrates the read operation of the third nano-Si FeRAM;

FIG. 10b is a flow chart of the read operation of the third operating method;

DETAILED DESCRIPTION OF THE EMBODIMENTS

To improve the retention of the conventional FeRAM, the present invention proposes the use of nano-Si in porous $SiO_2$ as the ferro-electric material for data storage in the spacer of MOSFET or gFET (referred to as nano-Si FeRAM in the text). The FeRAM cells in present invention combine advantages of new ferro-electric materials (nano-Si in porous SiO2), new device (gFET) and operation modes (GIDL), including low power consumption of the MOSFET's GIDL current, low threshold voltage of turn-on and high driving current of the gFET, and CMOS compatible process of nano-Si in porous SiO2.

The present invention provides several structures of FeRAM cells and operating methods as described in details below.

Figure 1A:
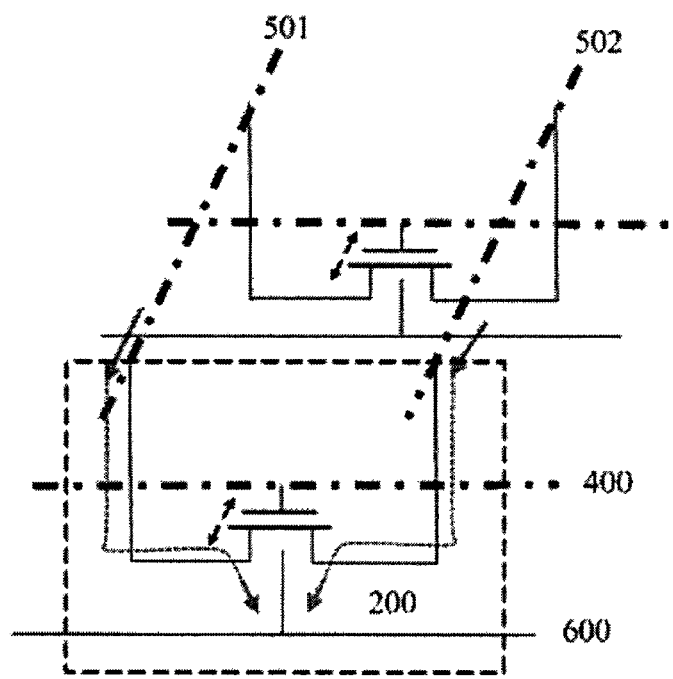
FIG. 1a is a schematical view of a first nano-Si FeRAM of the present invention.

The first embodiment of the present invention is a first nano-Si FeRAM with memory cells organized in an array. FIG. 1a schematically shows the first nano-Si FeRAM and FIG. 1b sketches the cross-section of a memory cell.

Figure 1B:
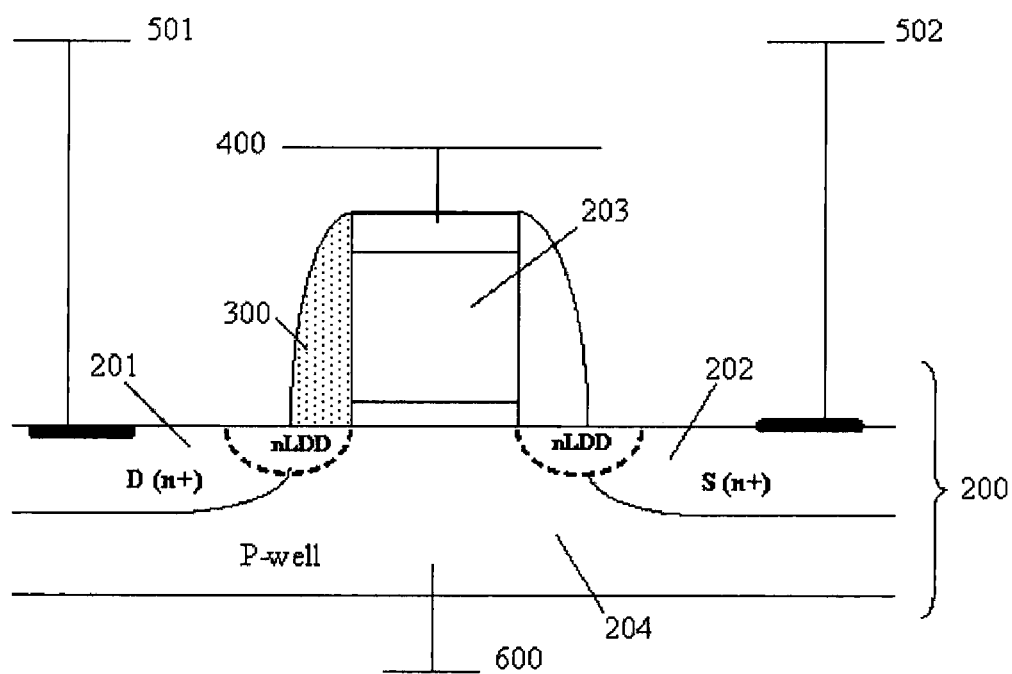
FIG. 1b is a cross-section view of a memory cell of the first nano-Si FeRAM.

As shown in FIG. 1a and FIG. 1b, a memory cell includes an n-type MOSFET 200 which contains a drain 201, a source 202, a gate 203 and a substrate 204. The spacer of the gate 203 on the drain side serves as a data storage element 300, and the material of the data storage element 300 is nano-Si in porous $SiO_2$. The gate 203 of the MOSFET 200 is connected to a word-line 400; the drain 201 and the source 202 are connected to a first bit-line 501 and a second bit-line 502 respectively. The substrate 204 is a thin Si-layer on an oxide layer over a bulk Si substrate (i.e. SOI). The GIDL current of the MOSFET serves as the read current of the memory cell.

The voltage bias on the gate 203 and the drain 201 establishes the electric field across the data storage element 300 for the formation of polarization in the data storage element 300. The polarization in the data storage element 300 will affect the magnitude of GIDL at drain during read operation due to the induced charges near the surface of the LDD region of drain 201.

It should be noted that the present invention measures the GIDL current to "read" the stored data instead of using the channel current in conventional MOSFET. Assume the FeRAM cell is based on n-type MOSFET, if the polarization in the data storage element 300 is from the gate 203 to the drain 201, then there is positive charge induced above the drain and attracting more electrons on the surface of the LDD region of the drain 201; this further results in less band-bending and smaller GIDL current. Reversely, if the polarization in the data storage element 300 is from the drain 201 to the gate 203, then there is induced negative charge above the drain and resulting in more band-bending and larger GIDL current. In this embodiment, since the spacer of the gate 203 on the source 202 side is formed by normal materials (i.e. non-ferro-electric material), the GIDL current at the source 202 is not affected by the polarization in the data storage element 300, and it is used as a reference current for comparison of magnitude of the GIDL current at the drain 201. Besides, in order to induce large enough GIDL currents at the drain 201 or the source 202, the voltage applied on the gate 203 is negative enough with respect to the voltage at the drain 201 or the source 202.

It should be noted that though the above FeRAM cell is assumed n-type MOSFET, the FeRAM cell with p-type MOSFET performs equally well if with proper reversing the voltage polarity during write and read operations and the details are not repeated for simplicity. We will use n-type MOSFET based FeRAM cell for illustration in the following description.

It should be further noted that during practical operations in memory, the voltage applied on the gate through the word-line does not exceed the threshold voltage (Vt) of MOSFET, so that there is no inversion channel in the MOSFET and there is no electrical connection between the source and the drain. It is known that the Vt of MOSFET can be adjusted to be high enough by Vt implant in CMOS process. Therefore, in this and later embodiments, the source and the drain are independent and never be shorted together electrically as the channel never inverted during the read and write operations.

Figure 2A:
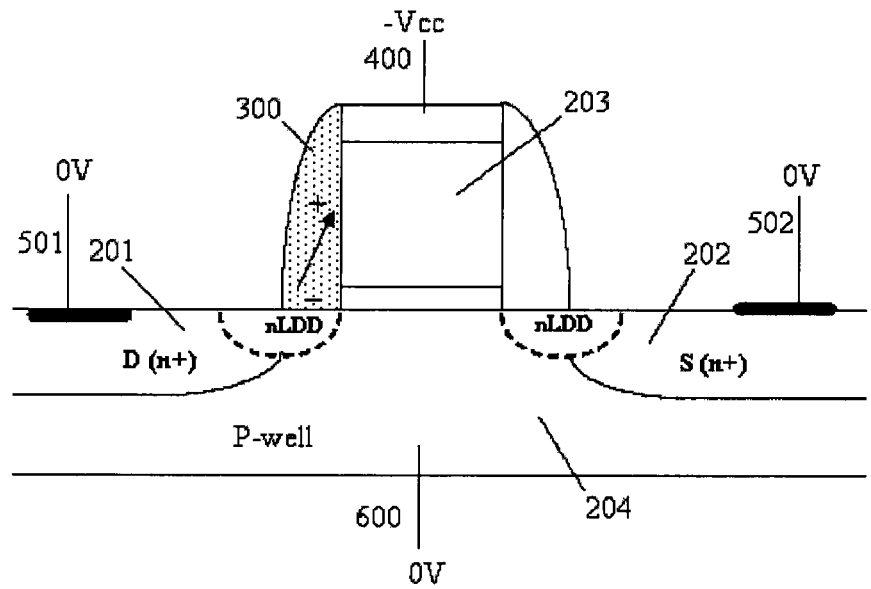
FIG. 2a and FIG. 2b illustrate the write operation of the first nano-Si FeRAM.
Figure 2B:
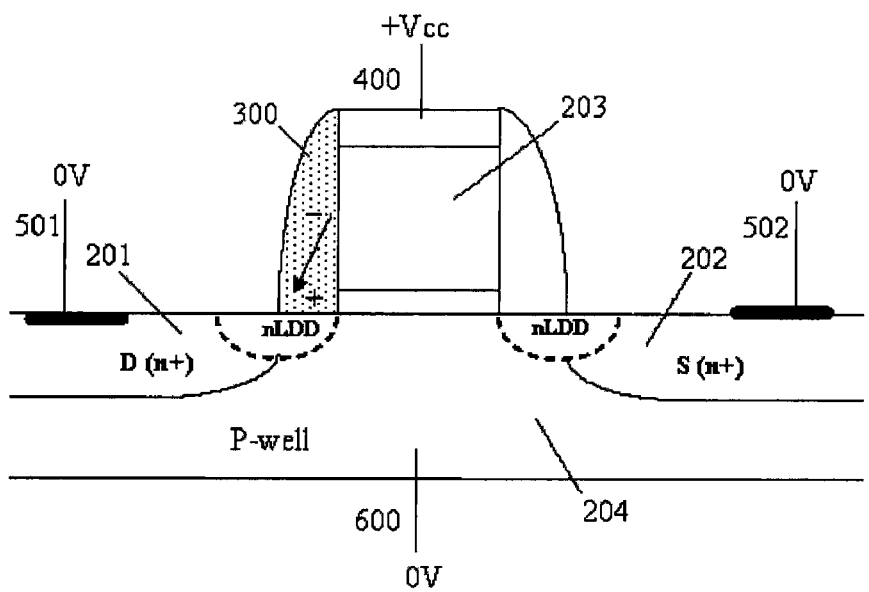

Based on the first nano-Si FeRAM described above, the present invention provides the first operating method as follows:

To facilitate the presentation, assume that the MOSFET is an n-type MOSFET, the Vcc is a positive external power supply; the threshold voltage of MOSFET is adjusted to be higher than Vcc, i.e. $V_t$>Vcc. FIG. 2a and FIG. 2b illustrate the write "1" and "0" operations of the first nano-Si FeRAM cell. The write operation of the first operating method includes:

Applying voltages at the first bit-line 501 and at the word-line 400 of a selected memory cell to establish a voltage across the gate 203 and the drain 201 of the MOSFET 200. The voltage difference establishes a large enough electric field on the data storage element 300 and forms polarization in the data storage element 300. As a result, data "1" or "0" is written into the memory cell.

The first bit-line 501 is biased to 0V, and the word-line 400 is biased to +Vcc or −Vcc (corresponding to the write operation of data "0" or "1" respectively). The Vcc is a positive external power supply. The voltage across the gate 203 and the drain 201 is Vcc and its magnitude is large enough to form polarization in the data storage element 300. As shown in FIG. 2a with gate bias at −Vcc, the polarization formed in the data storage element 300 is from the drain 201 to the gate 203 (i.e. data "1"). As shown in FIG. 2b with the gate bias at +Vcc, the resulted polarization in the data storage element 300 is from the gate 203 to the drain 201 (i.e. data "0").

The substrate 204 is set to 0V through the substrate bas supply 600. During the write "1" operation, the word-lines and bit-lines of un-selected memory cells are set to −Vcc/2 to avoid write disturbance; and during the write "0" operation, the word-lines and bit-lines of un-selected memory cells are set to +Vcc/2 to avoid write disturbance. Thus, during the write "1" or "0" operations, all un-selected cells experience a maximum voltage of Vcc/2 across the gate and drain for minimum disturb.

FIGS. 3a and 3b illustrate the read operation of the first nano-Si FeRAM. The read operation of the first operating method includes:

S100 (Step 100): Applying voltages at the first bit-line 501, at the second bit-line 502 and at the substrate bias supply 600, and make sure the voltage across the drain 201 and the substrate 204 is the same as the voltage across the source 202 and the substrate 204.

The first bit-line 501 and the second bit-line 502 are set to a small positive voltage (e.g. 0~0.1V), and the substrate bias supply 600 is set to a negative voltage (e.g. −Vcc/2).

S101: Applying a negative voltage (−Vcc/2) at the gate 203 through the word-line 400 to induce GIDL current at the drain 201 and the GIDL at source 202 (as reference current) of the MOSFET 200. By comparing the magnitude of the GIDL currents, the data in the memory cell can be determined.

The voltage across the gate and drain 201 and source 202 during read is no more than Vcc/2, therefore, there is minimum disturb to the polarization in the data storage element 300.

For convenience, the GIDL current at the drain 201 is named $I_A$, and the GIDL current at the source 202 is named $I_B$ (as reference current). The difference of the two GIDL currents $I_A$ and $I_B$ depends on the polarization in the data storage element 300, i.e. if $I_A$>$I_B$, the data stored is "1", and if $I_A$<$I_B$, the data stored is "0".

In the read operation, the word-lines and bit-lines of un-selected memory cells are set to 0V to avoid read disturb on un-selected cells.

In the above nano-Si FeRAM, only the spacer on one side of the gate serves as the data storage element, and each cell can store one bit. If the spacer on the other side of the gate also serves as a data storage element, then each cell can store 2 bits.

Figure 4A:
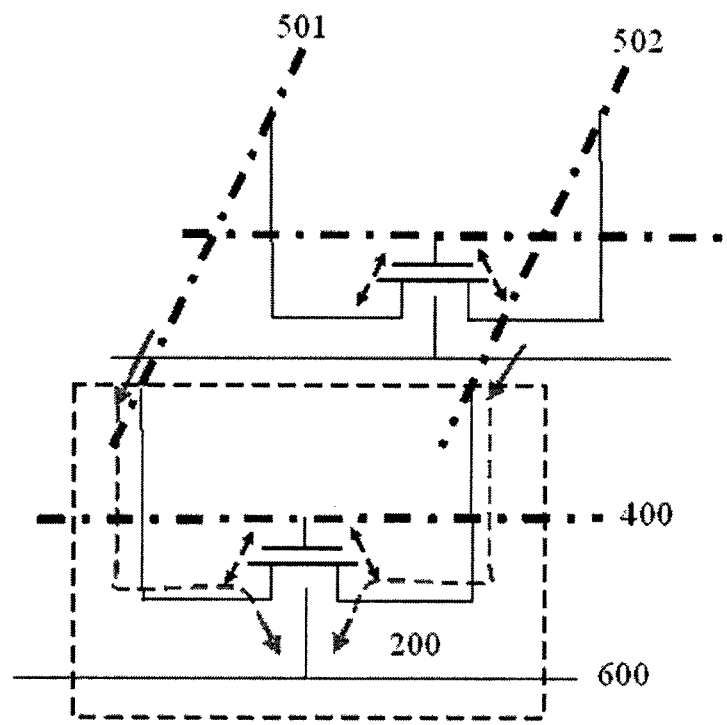
FIG. 4a is a schematical view of a second nano-Si FeRAM of the present invention.

Based on the previous discussion, the present invention provides a second nano-Si FeRAM, including a memory array of memory cells. FIG. 4a illustrates the second nano-Si FeRAM, and FIG. 4b sketches the cross-section of a memory cell.

Figure 4B:
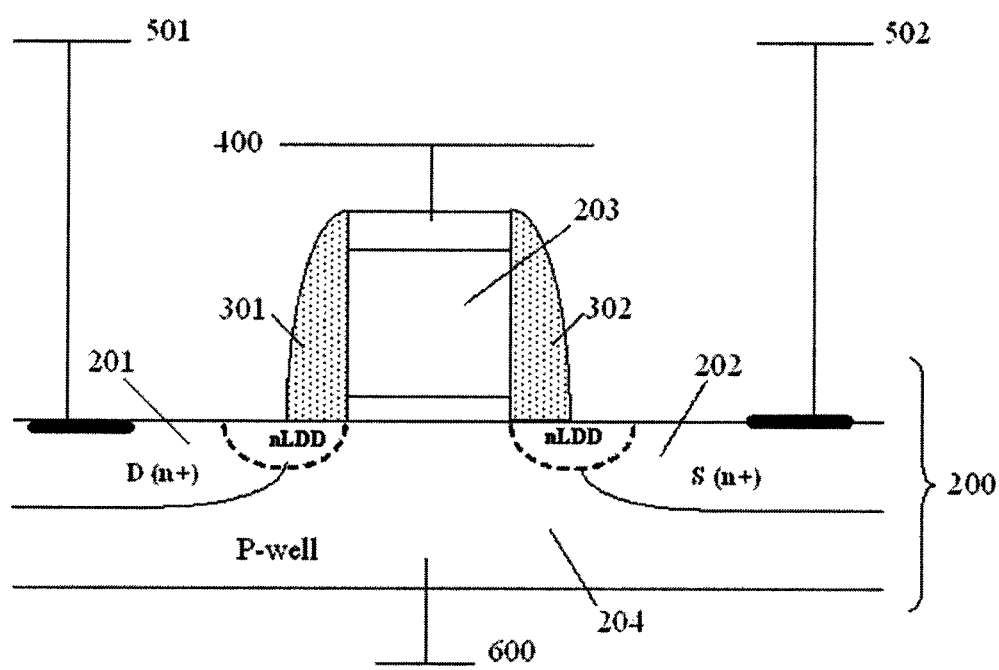
FIG. 4b is a cross-section view of a memory cell of the second nano-Si FeRAM.

As shown in FIG. 4a and FIG. 4b, the memory cell includes an n-type MOSFET 200 including a drain 201, a source 202, a gate 203, a substrate 204, a first bit-line 501, a second bit-line 502, and a substrate bias supply 600. The two spacers on each side of the gate 203 are made of nano-Si in porous $SiO_2$ and are the first data storage element 301 and the second data storage element 302. The gate 203 of the MOSFET 200 is connected to the word-line 400, the drain 201 and the source 202 are connected to the first bit-line 501 and the second bit-line 502 respectively, and the substrate 204 is connected to the substrate bias supply 600. The substrate 204 is the thin Si layer of silicon-on-insulator (SOI) wafer, and the GIDL current of the MOSFET serves as the read current of the memory cell.

Similar to the first nano-Si FeRAM cell, in this embodiment, the polarization in the first data storage element 301 and the second data storage element 302 will affect their GIDL currents depending on the direction of polarization respectively.

Figure 5A:
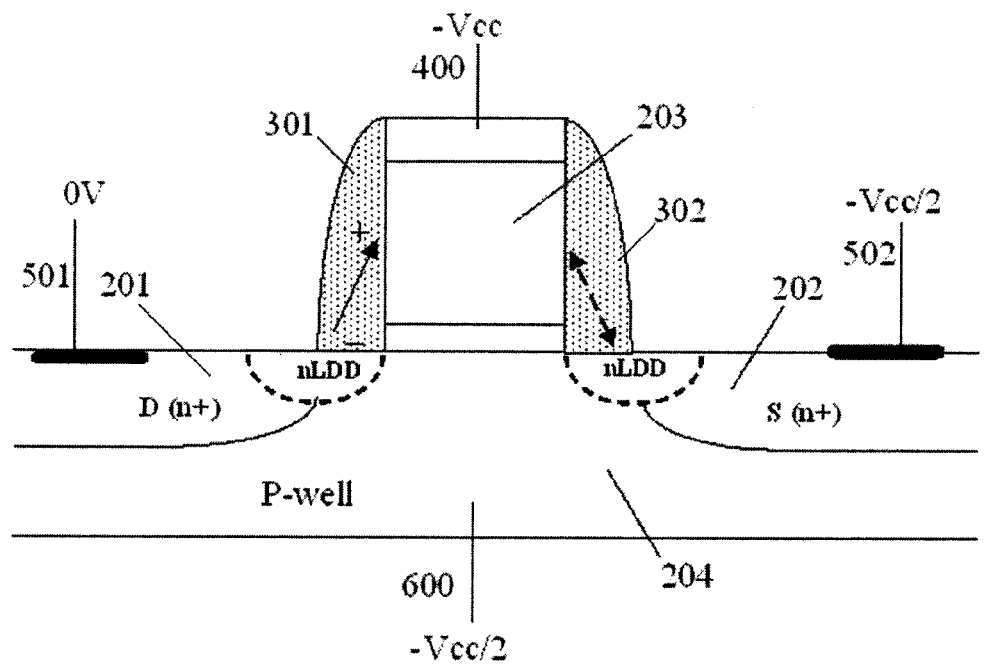
FIG. 5a and FIG. 5b illustrate the write operation of the second nano-Si FeRAM.
Figure 5B:
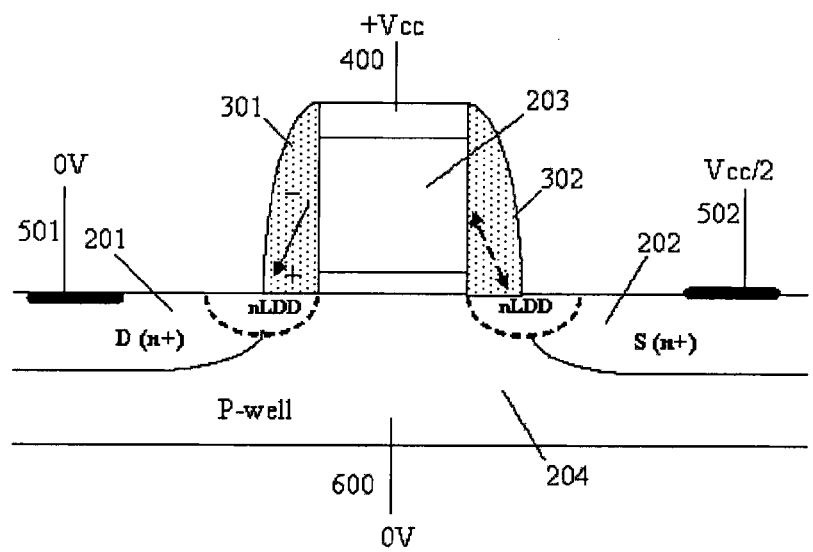

In the second nano-Si FeRAM, each memory cell stores 2 bits of data. The present invention provides the second operating method as follows:

To facilitate the presentation, assume that the MOSFET is an n-type MOSFET, the Vcc is a positive external power supply; the Vt of MOSFET is adjusted to be higher than Vcc, i.e. $V_t$>Vcc. FIG. 5a and FIG. 5b illustrate the write "1" and "0" operations of the second nano-Si FeRAM. The write operation of the second operating method includes:

To apply separate voltages at the first bit-line 501, at the second bit-line 502 and at the word-line 400 of a selected memory cell, and to establish voltage across the gate 203 and the drain 201 and across the gate 203 and the source 202, and this leads to large enough electric fields to form polarization in data storage elements 301 and 302.

As shown in FIG. 5a, data "1" is formed with the polarization in the first data storage element 301 from the drain 201 toward the gate 203. To achieve this, the first bit-line 501 is set to 0V; the word-line 400 is set to −Vcc. The electric field between the drain 201 to the gate 203 is large enough to form polarization with direction from the drain 201 to the gate 203 in the first data storage element 301.

To avoid disturb the polarization in the second data storage element 302, the second bit-line 502 is set to −Vcc/2, so the voltage across the gate 203 and the source 202 is Vcc/2 to avoid disturb to the polarization in the data storage element 302.

Furthermore, the substrate 204 is biased to −Vcc/2 through the substrate bias supply 600 during write "1" operation. The voltage across the gate 203 and the drain 201 is Vcc and is large enough to induce GIDL current. Also, the bit-lines and word-lines of un-selected memory cells are set to −Vcc/2 to avoid write disturbance.

As shown in FIG. 5b, data "0" is formed with the polarization in the first data storage element 301 is from the gate 203 to the drain 201. To achieve this, the first bit-line 501 is set to 0V, and the word-line is set to +Vcc. The electric field between the gate 203 and the drain 201 is from the gate 203 to the drain 201 and it is large enough to form polarization in the first data storage element 301.

To avoid affecting the second data storage element 302, the second bit-line 502 is set to Vcc/2 to avoid disturb of the polarization in the second data storage element 302.

Furthermore, the substrate 204 is set to 0V through the substrate bias supply 600 during write "0" operation. Under this condition, no GIDL current is induced.

Besides, during the write "0" operation, bit-lines and word-lines of un-selected memory cells are set to +Vcc/2 to avoid write disturbance.

By repeating the above methods of write "1" or "0", the second data storage element 302 can be stored with digital information "1" or "0". As a result, 2 bits of data can be stored in the 2 data storage elements in the cell, i.e. "00", "01", "10", and "11".

If the polarization in the first data storage element 301 and the second data storage element 302 are stored in opposite as pairs, i.e. "01" or "10", then the cell can store 1 bit of data.

FIGS. 6a and 6b illustrate the read operation of the second nano-Si FeRAM. The read operation of the second operating method includes:

S200: Applying voltages at the first bit-line 501, at the second bit-line 502 and at the substrate bias supply 600, and the voltage across the drain 201 and the substrate 204 is the same as the voltage across the source 202 and the substrate 204.

The first bit-line 501 and the second bit-line 502 are set to 0 v or a small positive voltage (e.g. 0~0.1V), and the substrate bias supply 600 is set to a negative voltage (e.g. −Vcc/2). The negative voltage on the gate 203 is large enough to induce GIDL currents in the MOSFET 200 at the drain 201 and the source 202.

S201: Applying a voltage at the gate 203 through the word-line 400 to induce GIDL currents at the drain 201 and the source 202 of the MOSFET 200. By measuring the magnitude of the two GIDL currents separately with respect to a reference current, the 2 bits of data in the memory cell can be determined.

The word-line 400 is set to −Vcc/2, the potential of the gate 203 is lower than that of the drain 201 and the source 202; the voltage difference is ~Vcc/2, which is large enough to induce the GIDL current at the drain 201 and the source 202 but small enough for minimum disturb on the polarization in the data storage elements.

If the polarization in the first data storage element 301 and the second data storage element 302 are formed in opposite as pairs i.e. "10" or "01". Then, the read operation simply compares the two GIDL currents directly (without the reference current), e.g. if $I_A$>$I_B$, the data is "1", and if $I_A$<$I_B$, the data is "0".

Besides, in the read operation, word-lines and bit-lines of un-selected memory cells are set to 0V to avoid read disturbance.

Within the first nano-Si FeRAM and the second nano-Si FeRAM, the GIDL current in MOSFET serves as the read current. As the gFET can be operated with low voltage, thus the role of conventional MOSFET in the FeRAM cell can be replaced by the gFETs with greater driving capability and lower operation voltage.

Figure 7A:
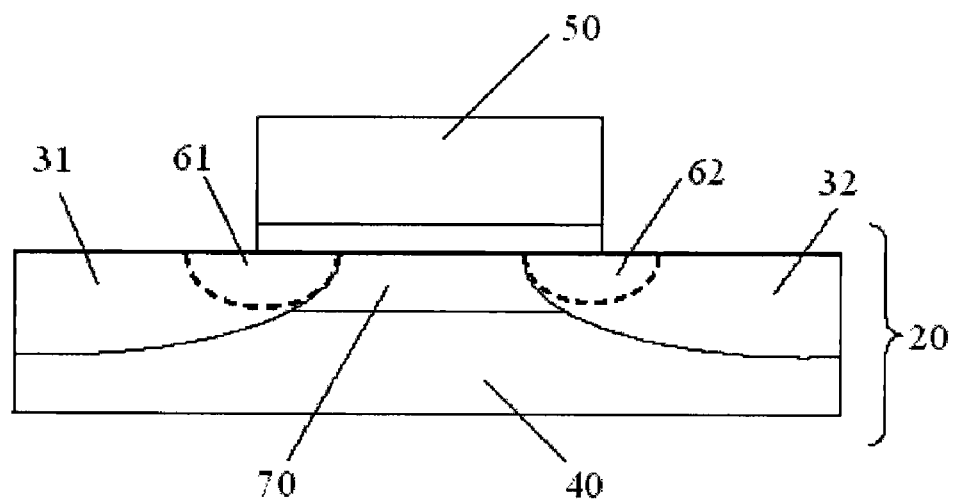
FIG. 7a is a cross-section view of a gFET of the present invention.

The present invention provides a new gFET with two sources symmetrically structured along the gate. FIG. 7a sketches the cross-section of a new gFET, including:

a substrate 20 made of the thin Si layer of the SOI or simply the bulk wafer 50 formed on the substrate 20, and separated from the substrate 20 by a gate dielectric; a drain 40 formed under the gate 50 and in the substrate 20; a first source 31 formed near one side of the gate 50 and in the drain 40; a first pocket implant region 61 formed in the first source 31; and a second source 32 and a second pocket implant region 62 formed under the other side of the gate 50 in the drain 40 symmetrically, spaced apart from the first source 61 and the first pocket implant region 61, both of the first pocket region 61 and the second pocket implant region 62 have the same conductivity as the drain 40, and have the opposite conductivity to the first source 31 and the second source 32.

According to different embodiments of the present invention, the gFET can be n-type or p-type based on the conductivity of the pocket implant region, this is similar to conventional gFET. We assume p-type gFETs in the following text for convenience.

In an embodiment of the present invention, the first and the second pocket implant regions are connected to the drain 40 through a lightly-doped region 70, under the gate 50 and with the same conductivity type as the first pocket implant region 61 and the second pocket implant region 62. The drain 40 serves as the electrical contact of the substrate 20.

Figure 7B:
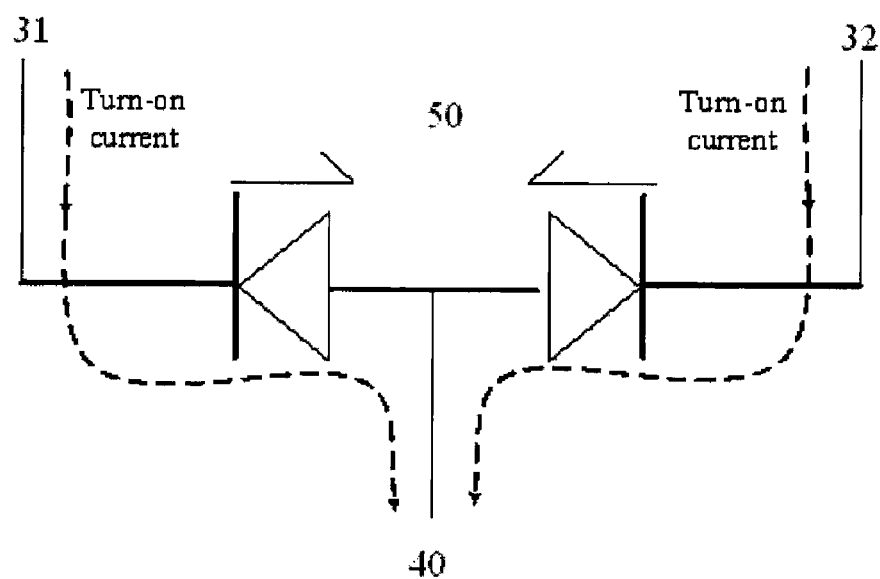
FIG. 7b is an equivalent-circuit diagram of the new gFET.

As shown in FIG. 7a, the first source 31, the first pocket implant region 61, the drain 40 and the gate 50 forms a conventional gFET, and the second source 32, the second pocket implant region 62, the drain 40 and the gate 50 forms the other conventional gFET. Therefore, the new gFET can be regarded as a parallel connection of two conventional gFETs with one shared gate 50 and two separate sources 31 and 32 as illustrated in FIG. 7b. Moreover, the new gFET is fully symmetrical in structure, e.g. the doping of the first source 31 and the second source 32.

Referring to FIG. 7a and FIG. 7b, the two merged parallel gFETs can be turned on by biasing the shared gate 50 and separately biasing the sources 31 and 32.

Figure 8A:
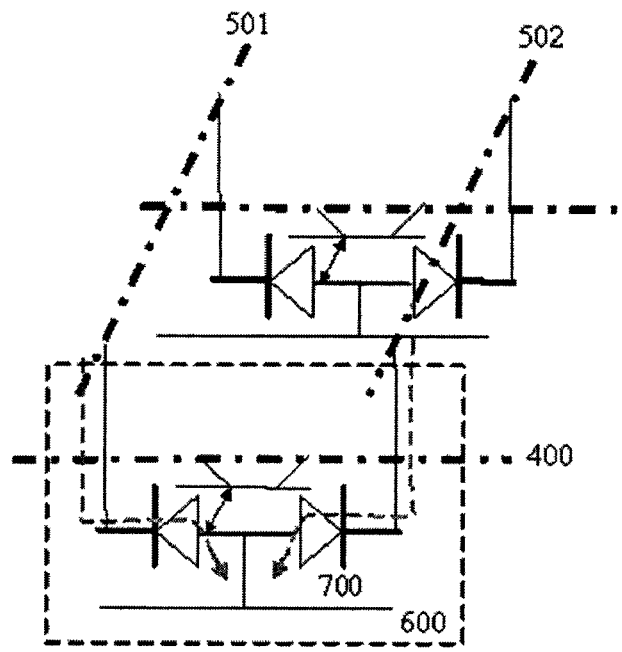
FIG. 8a is a schematical view of a third nano-Si FeRAM of the present invention.

The present invention provides the third nano-Si FeRAM using the above new gFET. FIG. 8a illustrates the third nano-Si FeRAM, and FIG. 8b sketches the cross-section of the third nano-Si FeRAM cell.

Figure 8B:
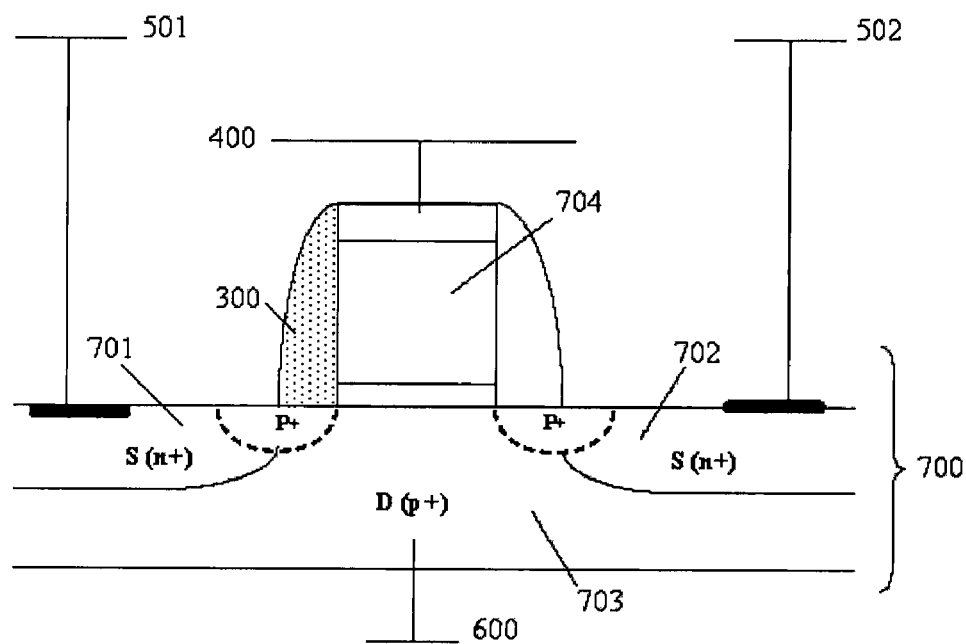
FIG. 8b is a cross-section view of a memory cell of the third nano-Si FeRAM.

As shown in FIG. 8a and FIG. 8b, a memory cell of the third nano-Si FeRAM includes: a p-type gFET 700, including a first source 701, a second source 702, a drain 703 and a gate 704. The spacer of the gate 704 on the first source side is a data storage element 300, the material of the data storage element 300 is nano-Si in porous $SiO_2$. The gate 704 of the gFET 700 is connected to a word-line 400, the first source 701 and the second source 702 are connected separately to a first bit-line 501 and a second bit-line 502, and the drain 703 is connected to a substrate bias supply 600. The band-to-band tunneling (BTBT) current of the gFET is the read operation current of the memory cell.

The voltage across the gate 704 and the first source 701 establishes an electric field to form polarization in the data storage element 300. The polarity of the polarization in the data storage element 300 will induce charge above the pocket implant region and affect the band-to-band tunneling (BTBT) mechanism and the magnitude of the turn-on current between the pocket implant region and the source.

Assume a p-type gFET for example, if the polarity of the polarization in the data storage element 300 is from the first source toward the gate, then the induced negative charge in the spacer above the pocket region will lower the potential of the pocket implant region and enhance the BTBT turn-on current at the first source 701.

In this embodiment, the spacer on the gate 704 near the second source 702 is made of conventional materials of Si-oxide or Si-nitride (i.e. non-ferro-electric material), so the turn-on current at the second source 702 is not altered by the polarization in the data storage element 300, thus it serves as a reference current of each cell.

During the read/write operations of the memory cell, one decide the direction of polarization in the data storage element 300 and read data by comparing the turn-on currents at the first source 701 and the second source 702. It should be noted that, in order to induce large enough turn-on current at the source, the gate is biased toward more negative with respect to the bias at the source (for p-type gFET).

The n-type gFET has the same or similar theories and behaviors with p-type gFET. We assume p-type gFET in the following discussions on memory cells.

Figure 9A:
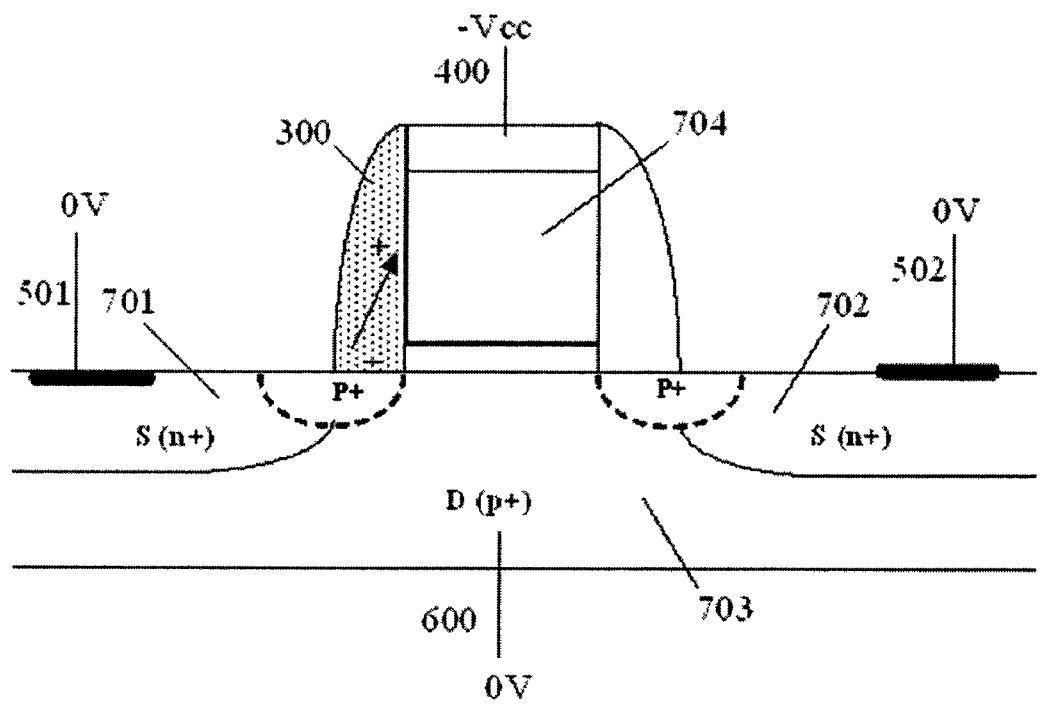
FIG. 9a and FIG. 9b illustrate the write operation of the third nano-Si FeRAM.
Figure 9B:
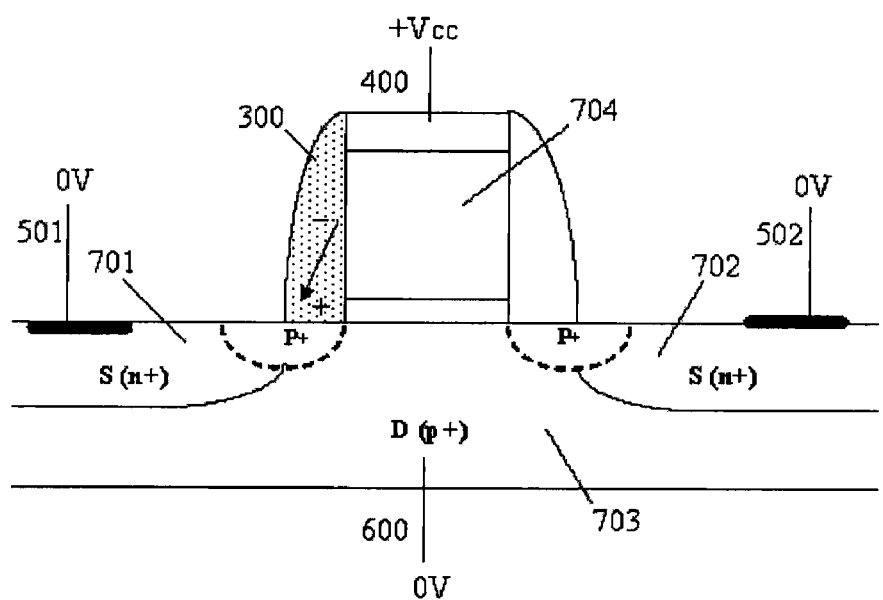

The present invention provides the third operating method based on the third nano-Si FeRAM as follows:

FIG. 9a and FIG. 9b illustrate the write operation of the third nano-Si FeRAM, which represent separately the write "1" and write "0" operations into the memory cell. The write operation of the third operating method includes:

Applying voltages at the first bit-line 501 and at the word-line 400 of a selected memory cell, to generate a voltage across the gate 704 and the first source 701 of the gFET 200. The voltage difference creates an electric field large enough to form polarization in the data storage element 300. As the result, data is written into the first storage element of the memory cell.

The first bit-line 501 is set to 0V, and the word-line 400 is set to +Vcc or −Vcc for write "0" and "1" respectively. As shown in FIG. 9a, if the bias at the gate 704 is set to −Vcc, the polarization formed in the data storage element 300 is from the first source 701 to the gate 704 and the data stored is defined as "1". Similarly, if the bias at the gate 704 is set to +Vcc, the polarization formed in the data storage element 300 is from the gate 704 to the first source 701, the data written in the memory cell is defined as "0".

During the write "1" and "0" operations, the word-lines and bit-lines of un-selected memory cells are set to −Vcc/2 and +Vcc/2 respectively to avoid disturbance of polarization during write operation. The bias at the drain 703 and the second source 702 are set to 0V.

FIGS. 10a and 10b illustrate the read operation of the third nano-Si FeRAM. The read operation of the third operating method includes:

S300: Applying voltages at the first bit-line 501, at the second bit-line 502 and at the substrate bias supply 600, and ensuring the same bias at the first source 701 and the second source 702.

The first bit-line 501 and the second bit-line 502 are set to a small positive voltage (e.g. 0V~0.1V), and the substrate bias supply 600 is set to −Vcc/2.

S301: Applying a voltage at the gate 704 through the word-line 400 to induce turn-on current at the first source 701 and the second source 702 of the gFET 700. The bias at the gate 704 is large enough to trigger large enough turn-on current at the first source 701 and the second source 702 for comparing their magnitude of the two turn-on currents so that the data in the memory cell can be determined.

For convenience, the turn-on current at the first source 701 is named $I_C$ (with magnitude depending on the polarization), and the turn-on current at the second source 702 is named $I_D$ as reference current. Therefore, the data stored in the polarization in the data storage element 300 can be determined by comparing the current of $I_C$ and $I_D$, i.e. "1" is determined if $I_C > I_D$, and "0" if $I_C < I_D$.

Besides, in the read operation, the word-lines and bit-lines of un-selected memory cells are set to 0V to avoid disturbance on polarization.

In the above nano-Si FeRAM cell, the spacer on one side of the gate is the data storage element, so each gFET has one bit storage. Since the spacer on the other side of the gate can also be made as the second data storage element, then, each gFET can store 2 bits for doubling the memory density. The tradeoff is that there is no local level reference current, but instead a common reference current is used from column or periphery circuits. As a further option, if the 2 data storage elements are written with pairs "10" or "01" representing 1 bit data, then the sense amplifier only need to compare the two turn-on currents with fast speed and no need of reference current.

Figure 11A:
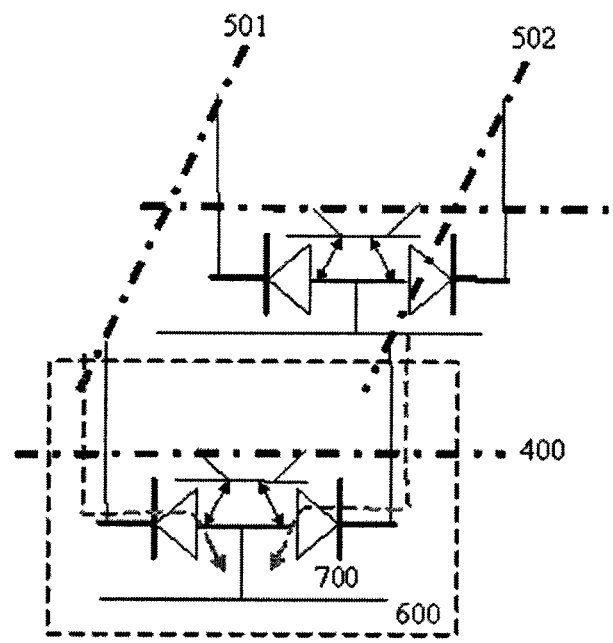
FIG. 11a is a schematical view of a fourth nano-Si FeRAM of the present invention.

Based on the previous discussion, the present invention provides a fourth nano-Si FeRAM, including a memory array of memory cells. FIG. 11a illustrates the fourth nano-Si FeRAM, and FIG. 11b sketches the cross-section of a memory cell.

Figure 11B:
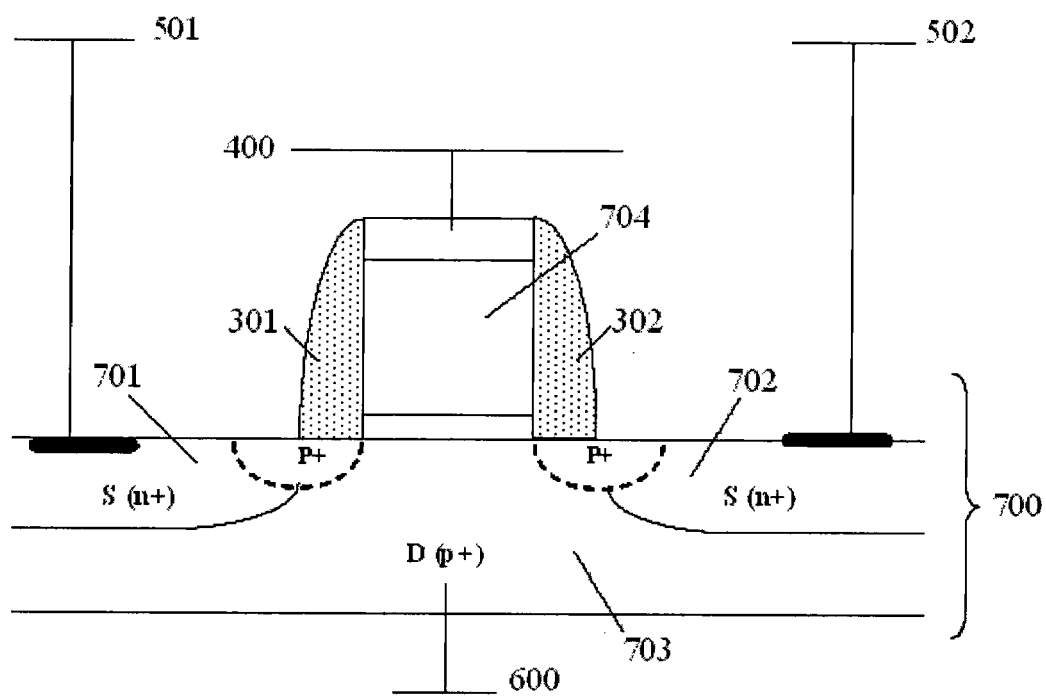
FIG. 11b is a cross-section view of a memory cell of the fourth nano-Si FeRAM.

As shown in FIG. 11a and FIG. 11b, the memory cell includes a gFET 700 including a drain 703, a first source 701, a second source 702, and a gate 704; two spacers 301 and 302 on each side of the gate 704; a first bit-line 501, a second bit-line 502, and a substrate bias supply 600. The spacer near the first source 701 is the first data storage element 301, and the other spacer near the second source 702 is the second data storage element 302. The spacer's material is nano-Si in porous $SiO_2$. The gate 704 is connected to the word-line 400, the first source 701 and the second source 702 are connected separately to the first bit-line 501 and the second bit-line 502, and the drain 703 is connected to the substrate bias supply 600. The BTBT current of the gFET is the read current of the memory cell.

Similar to the third nano-Si FeRAM, in this embodiment, the direction of polarization in the first and the second data storage elements (301 and 302) affects the turn-on currents at the first and second sources (701 and 702) respectively. Therefore, in this embodiment, the first data storage element 301 and the second data storage element 302 are two independent storage bits, and each memory cell stores 2 bits of data.

Figure 12A:
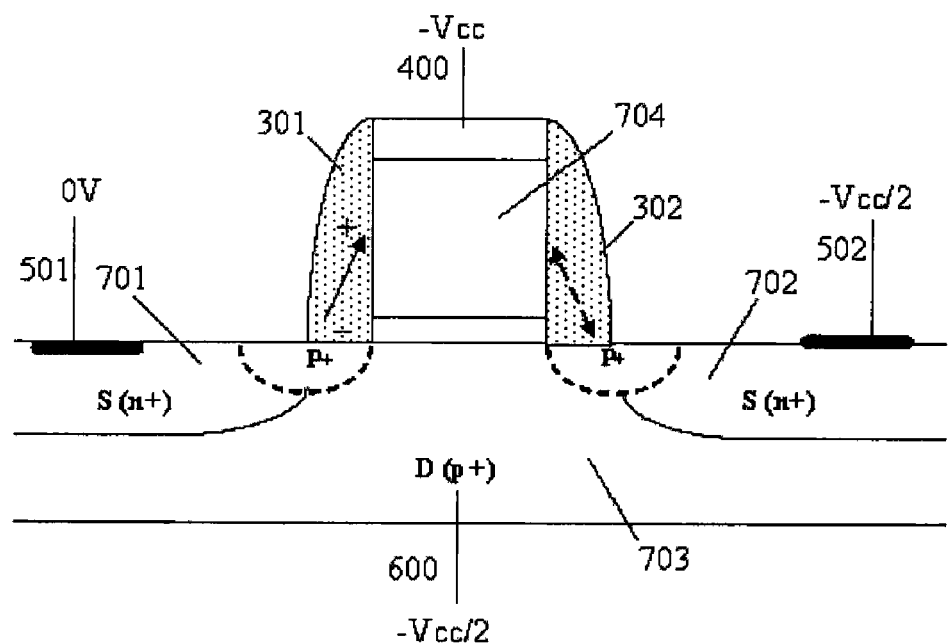
FIG. 12a and FIG. 12b illustrate the write operation of the fourth nano-Si FeRAM.
Figure 12B:
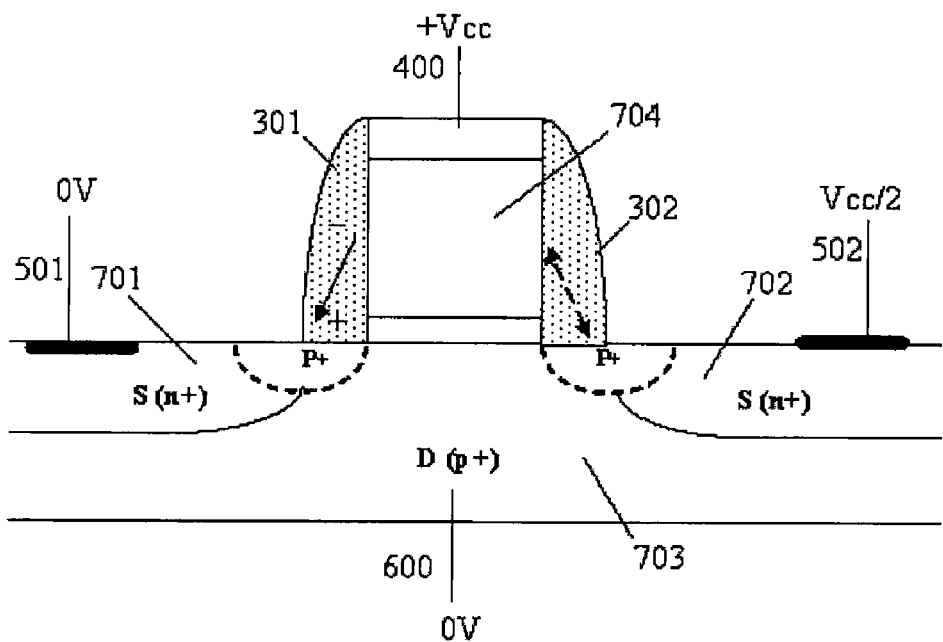

The present invention provides the fourth operating method as follows: To facilitate the presentation, assume that the gFET is p-type; the Vcc is a positive external power supply;

FIG. 12a and FIG. 12b illustrates the write "1" and "0" operations of the fourth nano-Si FeRAM cell. The write operation of the fourth operating method includes:

To apply separate voltages at the first bit-line 501, the second bit-line 502 and the word-line 400 of a selected memory cell, to establish voltage across the gate 704 and the first source 701, and across the gate 704 and the second source 702. The electric field in the first data storage element 301 is large enough for the formation of polarization. The electrical field in the second data storage element is not large enough to disturb the existing polarization. As the result, data is written into the first data storage element of memory cell.

As shown in FIG. 12a, data "1" is written in the first data storage element 301, while not disturb the data in the second data storage element. To achieve this, the first bit-line 501 is set to 0V, the word-line 400 is set to −Vcc, and the second bit-line is set to −Vcc/2. The electric field between the first source 701 and the gate 704 is from the first source 701 to the gate 704, and the voltage across the first source 701 and the gate 704 is Vcc, which is large enough to form polarization in the first data storage element 301. The voltage across the gate 704 and the second source 702 is −Vcc/2 and the electrical field in the second data storage element is not large enough to disturb the existing polarization in the second data storage element.

Furthermore, the drain 703, is set to −Vcc/2 through the substrate bias supply 600. During the write "1" operation, bit-lines and word-lines of un-selected memory cells are set to −Vcc/2 to avoid write "1" disturbance.

As shown in FIG. 12b, data "0" is written in the first data storage element 301, while no disturb the data in the second data storage element. To achieve this, the first bit-line 501 is set to 0V, the word-line is set to Vcc, the second bit-line is set to +Vcc/2. The electric field between the gate 704 and the first source 701 is from the gate 704 to the first source 701, with a voltage difference of Vcc which is large enough to form polarization in the first data storage element 301. The voltage across the gate 704 and the second source 702 is +Vcc/2 and the electrical field in the second data storage element is not large enough to disturb the existing polarization in the second data storage element Furthermore, the drain 703 is set to 0V. During the write "0" operation, bit-lines and word-line of un-selected memory cells are set to +Vcc/2, to avoid write "0" disturbance.

By repeating the above methods of write "1" or "0", the second data storage element 302 can be stored with digital information "1" or "0". As a result, 2 bits of data can be stored in the 2 data storage elements in the cell, i.e. "00", "01", "10", and "11".

Further, if the polarization in the first data storage element 301 and the second data storage element 302 are stored in opposite as pairs, i.e. "01" and "10". According to another embodiment, the status "01" and "10" can be defined as data "1" and "0" respectively.

Figure 13A:
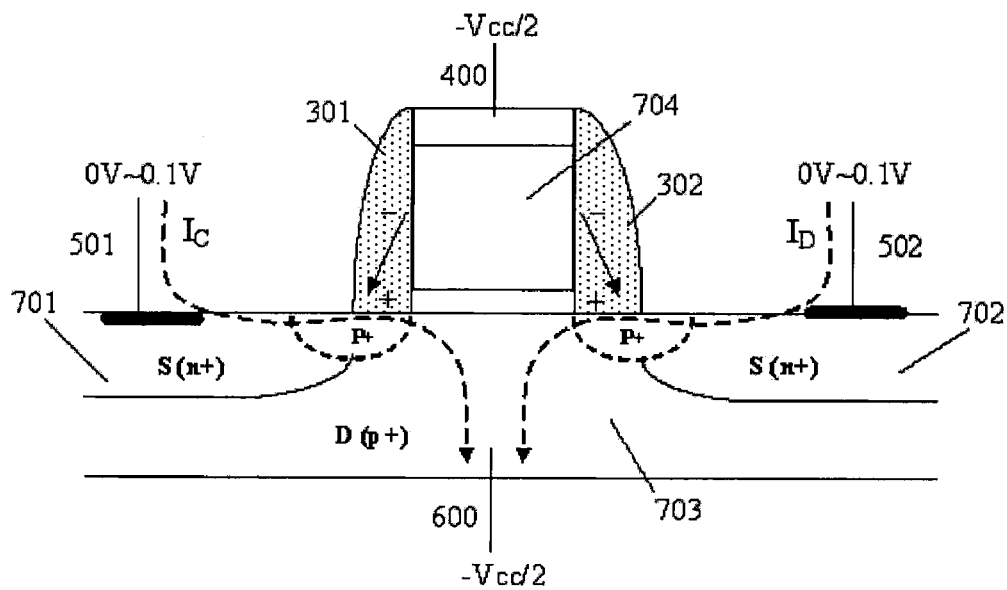
FIG. 13a illustrates the read operation of the fourth nano-Si FeRAM.
Figure 13B:
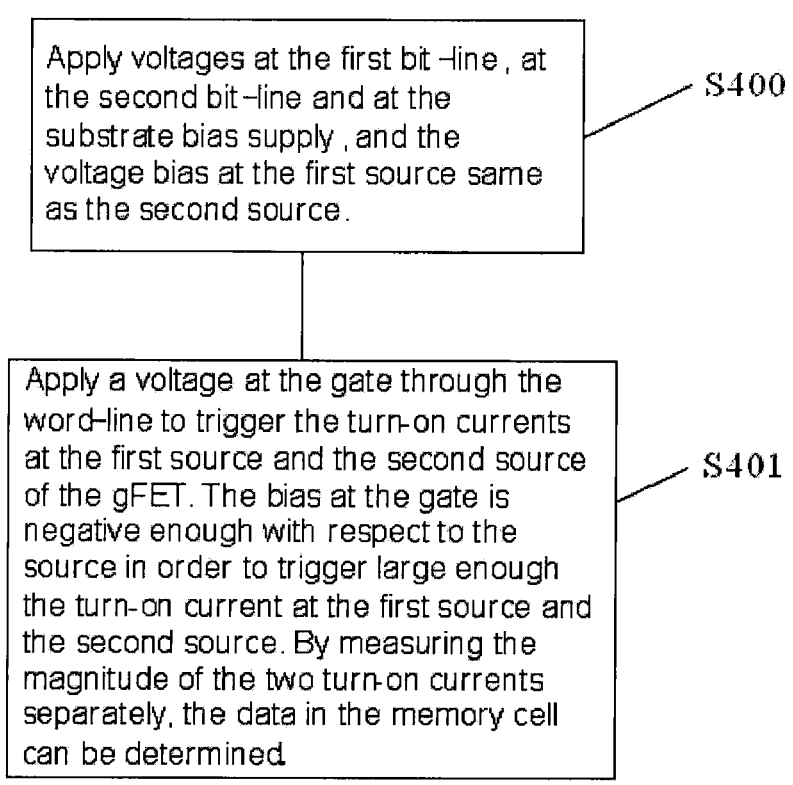
FIG. 13b is a flow chart of the read operation of the fourth operating method.
Figure 14:
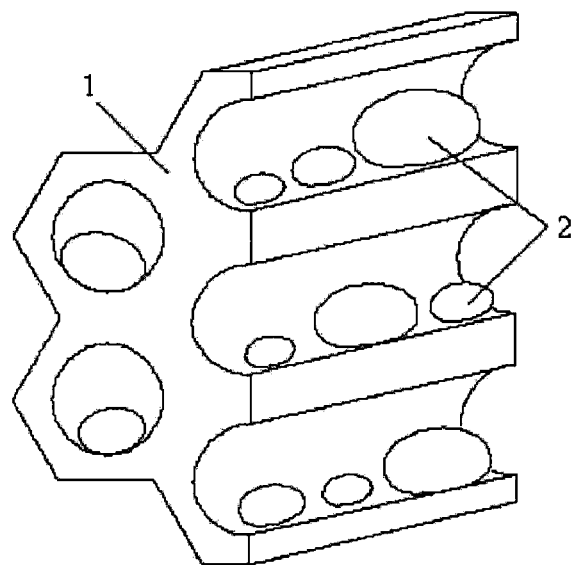
FIG. 14 is a sketch of the material structure of nano-Si in porous $SiO_2$.
Figure 15:
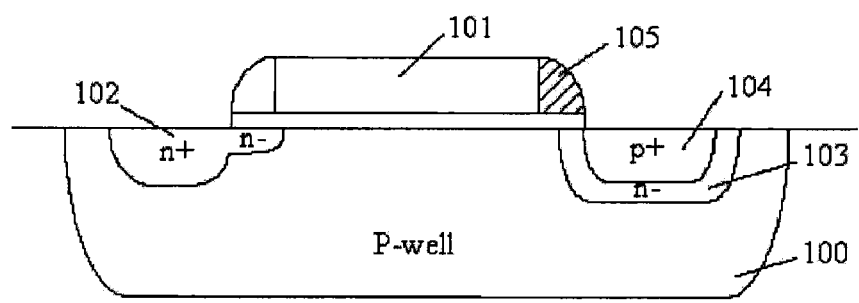
FIG. 15 is a cross-section view of a conventional FeRAM.
Figure 16:
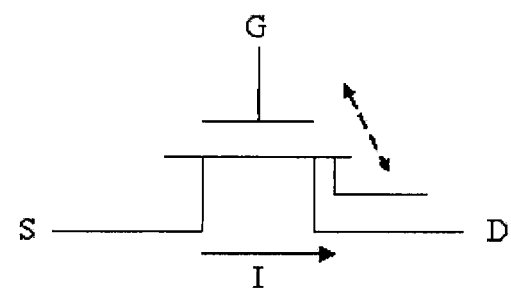
FIG. 16 is an equivalent-circuit diagram of the FeRAM in FIG. 2.
Figure 17A:
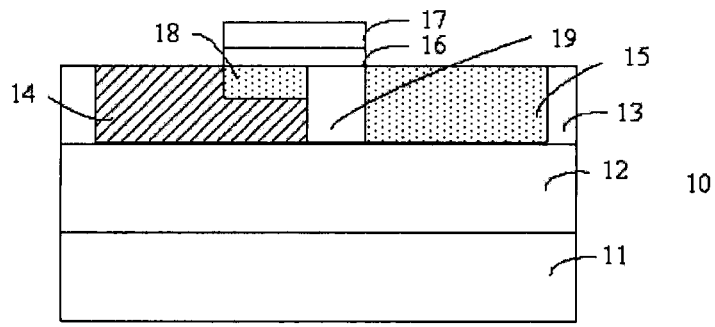
FIG. 17a is a cross-section view of a conventional gFET.
Figure 17B:
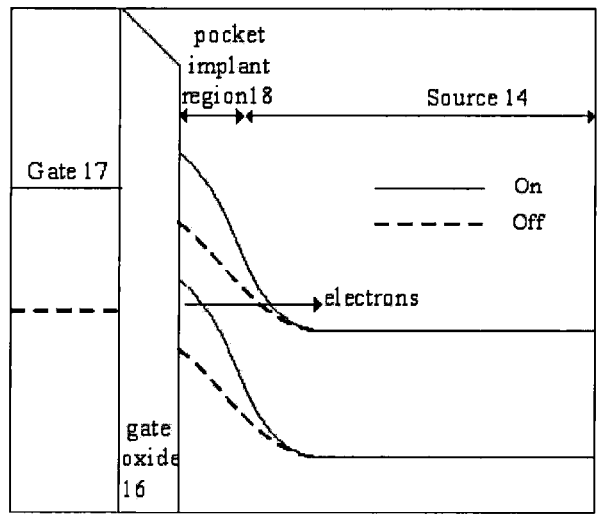
FIG. 17b is a band diagram showing the band-bending near the pocket implant region of a conventional p-type gFET.
Figure 17C:
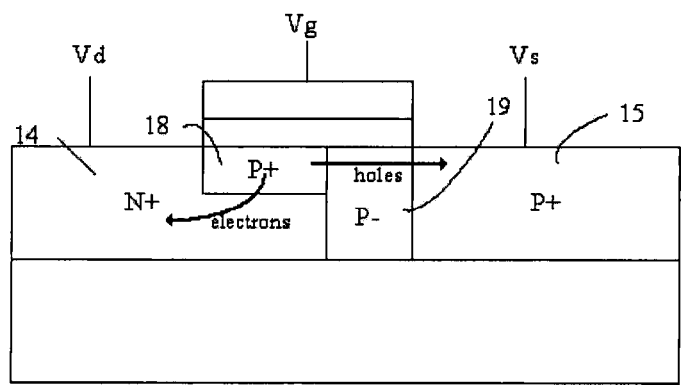
FIG. 17c illustrates the turn-on current at a conventional p-type gFET.

FIGS. 13a and 13b illustrate the read operation of the fourth nano-Si FeRAM. The read operation of the fourth operating method includes:

S400: Apply voltages at the first bit-line 501, at the second bit-line 502 and at the substrate bias supply 600, and the voltage bias at the first source 701 same as the second source 702.

The first bit-line 501 and the second bit-line 502 are set to a small positive voltage (e.g. 0V~0.1V), and the substrate bias supply 600 is set to −Vcc/2.

S401: Apply a voltage at the gate 704 through the word-line 400 to trigger the turn-on currents at the first source 701 and the second source 702 of the gFET 700. The bias at the gate 704 is negative enough with respect to the source in order to trigger large enough the turn-on current at the first source 701 and the second source 702. By measuring the magnitude of the two turn-on currents separately, the data in the memory cell can be determined.

For convenience, the turn-on current at the first source 701 is named $I_C$, the turn-on current at the second source 702 is named $I_D$. Suppose that a large turn-on current represents "1" in correspondent storage bit, and a small turn-on current represents "0". To read separately the data of the first data storage element 301 and of the second data storage element 302, then combine the results to get the stored data of the memory cell.

If the polarization in the first data storage element 301 and the second data storage element 302 are stored in opposite as pairs, i.e. "10" and "01". As another option, the read operation is simply a comparison of the two turn-on currents, i.e. data "1" if $I_C > I_D$, and data "0" if $I_C < I_D$.

Besides, in the read operation, word-lines and bit-lines of un-selected memory cells are set to 0V to avoid read disturbance.

In the above embodiments, p-type gFET is used in nano-Si FeRAM, it is apparent to those skilled in the art that n-type gFET can also perform as the select transistor.

While the present invention has been illustrated and described with reference to some preferred embodiments of the present invention, it is apparent to those skilled in the art that various variations and modifications can be made without departing from the spirit and scope of the present invention, and these variations and modifications is intended to be covered by the present invention provided that they are within the spirit and scope of the accompanying claims and their equivalents.

What is claimed is:

1. A nano-Si FeRAM, including a plurality of memory cells arranged in an array with bit-lines and word-lines, the bit-lines including first bit-lines and second bit-lines, each memory cell comprising:
 a MOSFET including a gate, a source, a drain, a substrate, and two data storage elements formed on the two spacers of the gate and made of nano-Si in porous $SiO_2$;
 a word-line connected to the gate;
 a first bit-line connected to the drain;
 a second bit-line connected to the source; and
 a substrate bias supply connected to the substrate,
wherein the GIDL current of the MOSFET serves as the read current of the memory cell.

2. The nano-Si FeRAM as claimed in claim 1, wherein the MOSFET is an NMOS transistor or a PMOS transistor.

3. The nano-Si FeRAM as claimed in claim 2, wherein when a memory cell is selected, read or written, the voltage applied on the gate through the word-line is smaller than the threshold voltage of the MOSFET.

4. A method of operating the nano-Si FeRAM as claimed in claim 1, comprising:
 a write operation comprising:
  providing a first voltage at the first bit-line;
  providing a second voltage at the second bit-line; and
  providing a third voltage at the word-line to establish voltage differences between the gate and the drain and between the gate and the source, which results in polarization in the two data storage elements for writing data; and
 a read operation comprising:
  providing a first voltage at the first bit-line;
  providing a second voltage same with the first voltage at the second bit-line;
  providing a third voltage at the substrate bias supply to establish voltage difference between the source and the substrate and between the drain and the substrate;
  providing a fourth voltage at the word-line to trigger GIDL currents at the source and the drain; and
  measuring the two GIDL currents to read data.

5. The method as claimed in claim 4, wherein for both data storage elements, each data storage element stores one bit of data, and in the write operation,
 when the polarization in a data storage element is from the drain or the source to the gate, the data written into the data storage element is defined as "1"; and
 when the polarization in a data storage element is from the gate to the drain or the source, the data written into the data storage element is defined as "0".

6. The method as claimed in claim 5, wherein in the read operation, in both the source and the drain, a large GIDL current represents data "1" and a small GIDL current represents data "0" with comparison to a reference current.

7. The method as claimed in claim 4, wherein if the polarization in the two data storage elements are stored in opposite to each other,
 when the polarization in the first data storage element is from the drain to the gate and the polarization in the second data storage element is from the gate to the source, the data written into the memory cell is defined as "1"; and
 when the polarization in the first data storage element is from the gate to the drain and the polarization in the second data storage element is from the source to the gate, the data written into the memory cell is defined as "0".

8. The method as claimed in claim 7, wherein in the read operation,
 when the GIDL current at the drain is larger than the GIDL current at the source, the data in the memory cell is "1"; and
 when the GIDL current at the drain is smaller than the GIDL current at the source, the data in the memory cell is "0".

* * * * *